(12) United States Patent
Huang et al.

(10) Patent No.: US 12,368,082 B2
(45) Date of Patent: Jul. 22, 2025

(54) IGBT CHIP INTEGRATING TEMPERATURE SENSOR

(71) Applicant: HUAWEI TECHNOLOGIES CO., LTD., Guangdong (CN)

(72) Inventors: Boning Huang, Dongguan (CN); Wentao Yang, Dongguan (CN); Junhe Wang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 438 days.

(21) Appl. No.: 17/994,053

(22) Filed: Nov. 25, 2022

(65) Prior Publication Data
US 2023/0087724 A1    Mar. 23, 2023

Related U.S. Application Data

(63) Continuation of application No. PCT/CN2021/093711, filed on May 13, 2021.

(51) Int. Cl.
*H10D 12/00* (2025.01)
*H01L 23/34* (2006.01)
(Continued)

(52) U.S. Cl.
CPC .......... *H01L 23/34* (2013.01); *H01L 23/5226* (2013.01); *H01L 23/5283* (2013.01);
(Continued)

(58) Field of Classification Search
CPC ........ H01L 23/34; G01K 7/22; H10D 62/127; H10D 12/441; H10D 89/00; H10D 12/411–491; H10D 62/141–148
See application file for complete search history.

(56) References Cited

U.S. PATENT DOCUMENTS

| 5,726,481 A | 3/1998 | Moody |
| 6,906,399 B2 | 6/2005 | Fruth et al. |
| 2022/0130821 A1* | 4/2022 | Nakano ............... H10D 62/8325 |

FOREIGN PATENT DOCUMENTS

| CN | 110462840 A | 11/2019 |
| CN | 111816652 A | 10/2020 |
| JP | 4620889 B2 | 1/2011 |

OTHER PUBLICATIONS

Office Action for Chinese Application No. 202010465356.8 dated Jan. 6, 2024, 8 pages.

(Continued)

*Primary Examiner* — Wasiul Haider

(57) ABSTRACT

The technology of this disclosure relates to an IGBT chip integrating a temperature sensor, and relates to the field of power device technologies, to improve accuracy of temperature monitoring of the IGBT chip. The IGBT chip integrating the temperature sensor includes a cell region, an emitter pad, a gate pad, a gate finger structure, a temperature sensing module, and a conductive shielding structure. The emitter pad is electrically connected to emitters of a plurality of IGBT cells. The gate finger structure is connected between the gate pad and gates of the plurality of IGBT cells. The temperature sensing module includes a temperature sensor, an anode pad, a cathode pad, and a metal lead. The temperature sensor and at least a part of the metal lead are located in the gate finger structure and are insulated from the gate finger structure.

12 Claims, 12 Drawing Sheets

(51) Int. Cl.
    *H01L 23/522*     (2006.01)
    *H01L 23/528*     (2006.01)
    *H01L 23/552*     (2006.01)
    *H10D 62/10*     (2025.01)
    *H10D 64/23*     (2025.01)
    *H10D 64/27*     (2025.01)
    *H10D 84/80*     (2025.01)

(52) U.S. Cl.
    CPC ......... *H01L 23/552* (2013.01); *H10D 12/411* (2025.01); *H10D 62/127* (2025.01); *H10D 64/231* (2025.01); *H10D 64/512* (2025.01); *H10D 84/811* (2025.01)

(56) References Cited

OTHER PUBLICATIONS

International Search Report for PCT Application No. PCT/CN2021/093711 dated May 13, 2021, 11 pages.

* cited by examiner

IGBT CHIP INTEGRATING TEMPERATURE SENSOR

CROSS-REFERENCE TO RELATED APPLICATIONS

This application is a continuation of International Application No. PCT/CN2021/093711, filed on May 13, 2021, which claims priority to Chinese Patent Application No. 202010465356.8, filed on May 27, 2020. The disclosures of the aforementioned applications are hereby incorporated by reference in their entireties.

TECHNICAL FIELD

This disclosure relates to the field of power device technologies, and in particular, to an IGBT chip integrating a temperature sensor.

BACKGROUND

In an application field of an electric vehicle, an elevator, and the like, an insulated gate bipolar transistor (IGBT) module needs to implement miniaturization, high power density, and a low junction temperature as far as possible, and reliability of the IGBT module needs to be quite high. Therefore, a temperature of an IGBT chip in the IGBT module needs to be monitored accurately in real time.

To monitor the temperature of the IGBT chip, on one hand, a temperature sensor (such as a thermistor) and the IGBT chip may be packaged together. Because a distance between the temperature sensor and the IGBT chip is short, the temperature of the IGBT chip can be obtained by using the temperature sensor. However, there is still a specific distance between the temperature sensor and the IGBT chip, and heat of the IGBT chip is partially conducted to the temperature sensor and a response speed is low. Consequently, accuracy of monitoring the temperature of the IGBT chip by the temperature sensor is reduced. On the other hand, the temperature sensor may be directly integrated into the IGBT chip. Because the temperature sensor is directly integrated into the IGBT chip, a response time constant during temperature monitoring is small, and a measured temperature can be obtained more quickly and accurately. However, the temperature sensor is integrated into the IGBT chip, a distance between a signal circuit on the IGBT chip and a metal lead of the temperature sensor is short, and interference is easily caused to a monitoring signal transmitted on the metal lead of the temperature sensor, thereby resulting in low accuracy of temperature sensing. Consequently, the temperature of the IGBT chip still cannot be accurately obtained.

SUMMARY

Embodiments of this disclosure provide an IGBT chip integrating a temperature sensor, so as to improve accuracy of temperature monitoring of the IGBT chip.

To achieve the foregoing objective, some embodiments of this disclosure provide an IGBT chip integrating a temperature sensor. The IGBT chip includes a cell region, an emitter pad, a gate pad, a gate finger structure, a temperature sensing module, and a conductive shielding structure. The cell region includes a plurality of IGBT cells. The emitter pad is disposed on the cell region, and is electrically connected to emitters of the plurality of IGBT cells. The gate pad and the gate finger structure each are located in the cell region, and the gate finger structure is connected between the gate pad and gates of the plurality of IGBT cells. The temperature sensing module includes a temperature sensor, an anode pad, a cathode pad, and a metal lead connected between the temperature sensor, the anode pad, and the cathode pad. The temperature sensor and a part of the metal lead are located in the gate finger structure and are insulated from the gate finger structure. The conductive shielding structure is at least disposed between the gate finger structure and a part that is of the metal lead and that is located in the gate finger structure, and is insulated from the metal lead and the gate finger structure. The conductive shielding structure is electrically connected to the emitter pad.

In the IGBT chip provided in this embodiment of this disclosure, the IGBT chip includes the cell region, the emitter pad, the gate pad, the gate finger structure, and the temperature sensing module, the gate finger structure passes through the cell region, and the temperature sensor and at least a part of the metal lead that are of the temperature sensing module are located in the gate finger structure. Therefore, a true temperature of the IGBT chip can be detected by using the temperature sensor, thereby improving accuracy of temperature monitoring. In addition, the IGBT chip further includes a conductive shielding structure. The conductive shielding structure is at least disposed between the gate finger structure and the part that is of the metal lead and that is located in the gate finger structure, the conductive shielding structure is electrically connected to the emitter pad, and the emitter pad is usually grounded. Therefore, the conductive shielding structure may be used to perform shielding between a transmission signal in the metal lead and a transmission signal in the gate finger structure, to prevent crosstalk between the transmission signal in the metal lead and the transmission signal in the gate finger structure, thereby ensuring accuracy of sampling and monitoring of the temperature sensing module.

Optionally, the gate finger structure includes a first polysilicon bus, a first metal bus, and a first contact hole. The first polysilicon bus and the first metal bus are separated by using a medium layer, and the first polysilicon bus is electrically connected to the first metal bus through the first contact hole. The conductive shielding structure is a metal wire at least disposed between the first metal bus and the part that is of the metal lead and that is located in the gate finger structure. This structure is simple, and has low costs.

Optionally, the first metal bus, the metal lead, and the conductive shielding structure are obtained by etching the same layer of metal. In this way, the first metal bus, the metal lead, and the conductive shielding structure have high production efficiency.

Optionally, the gate finger structure includes a first polysilicon bus, a first metal bus, and a first contact hole. The first polysilicon bus and the first metal bus are separated by using a medium layer, and the first polysilicon bus is electrically connected to the first metal bus through the first contact hole. The conductive shielding structure includes a second polysilicon bus, a second metal bus, and a second contact hole. The second polysilicon bus and the second metal bus are separated by using a medium layer, and the second polysilicon bus is electrically connected to the second metal bus through the second contact hole, the second polysilicon bus is at least located between the first polysilicon bus and the part that is of the metal lead and that is located in the gate finger structure, the second metal bus is at least located between the first metal bus and the part that is of the metal lead and that is located in the gate finger structure, and the conductive shielding structure is electrically connected to the emitter pad through the second metal bus. In this structure, a shielding channel including the conductive shielding structure is relatively great in height, to effectively prevent crosstalk between the transmission signal in the metal lead and the transmission signal in the gate finger structure, thereby ensuring accuracy of sampling and monitoring of the temperature sensing module.

Optionally, a first breakpoint is provided on a part that is of the gate finger structure and that is located between the conductive shielding structure and the emitter pad, and an electrical connection line between the conductive shielding structure and the emitter pad passes through the first breakpoint. This structure is simple, and is easy to implement.

Optionally, the IGBT chip further includes a gate bus and a terminal region, the gate bus is disposed at an edge of the cell region, and the terminal region is disposed at a periphery of the cell region. A metal loop line is provided in the terminal region, the metal loop line is disposed around the periphery of the cell region, and the metal loop line is electrically connected to the emitter pad. A second breakpoint is provided on a part that is of the gate bus and that is located between the conductive shielding structure and the metal loop line, the conductive shielding structure is electrically connected to the metal loop line, and an electrical connection line between the conductive shielding structure and the metal loop line passes through the second breakpoint. In this way, the conductive shielding structure is electrically connected to the emitter pad by using the metal loop line in the terminal region. This structure is simple, and is easy to implement.

Optionally, a third breakpoint is provided on a part that is of the gate bus and that is located between the metal loop line and the emitter pad, and an electrical connection line between the metal loop line and the emitter pad passes through the third breakpoint. This structure is simple, and is easy to implement.

Optionally, the temperature sensor includes at least one first polysilicon diode, the at least one first polysilicon diode is disposed in series, the metal lead includes an anode lead and a cathode lead, a P-type region constituting one end of a series structure of the at least one first polysilicon diode is electrically connected to the anode pad through the anode lead, and an N-type region constituting the other end of the series structure of the at least one first polysilicon diode is electrically connected to the cathode pad through the cathode lead. In this way, the temperature sensor can monitor a temperature by using the at least one first polysilicon diode. A polysilicon diode has a small volume, and can be easily integrated into a small-size IGBT chip.

Optionally, the temperature sensor further includes at least one second polysilicon diode, the at least one second polysilicon diode is disposed in series, an N-type region constituting one end of a series structure of the at least one second polysilicon diode is electrically connected to the anode pad through the anode lead, and a P-type region constituting the other end of the series structure of the at least one second polysilicon diode is electrically connected to the cathode pad through the cathode lead. In this way, the at least one second polysilicon diode and the at least one first polysilicon diode are connected in anti-parallel, so that the temperature sensor can be prevented from being broken down when a reverse voltage is applied.

Optionally, the gate finger structure passes through a center of the cell region, and the temperature sensor is disposed in a part that is of the gate finger structure and that is located at the center. In this way, the temperature sensor is located at the center of the cell region, and a temperature at the center of the cell region is the highest. Therefore, a highest temperature of the cell region can be detected by using the temperature sensor, thereby improving accuracy of temperature monitoring.

Optionally, the metal lead extends along a length direction of the gate finger structure, and the metal lead is entirely located in the gate finger structure. In this way, the metal lead does not interfere with emitter metal of the IGBT cell in the cell region, and therefore, the metal lead does not occupy an effective area of the cell region. In this way, an area of the IGBT chip can be made relatively small without changing a quantity of IGBT cells in the cell region, thereby meeting a requirement for miniaturization design of the IGBT chip.

Optionally, the conductive shielding structure is annular, and the conductive shielding structure is disposed around a periphery of the metal lead. In this way, the conductive shielding structure can prevent, in a peripheral direction of the metal lead, an external signal of the conductive shielding structure from interfering with a transmission signal in the metal lead, thereby ensuring accuracy of sampling and monitoring of the temperature sensing module.

Optionally, the anode pad and the cathode pad are disposed at the edge part of the cell region. Because a specific gap is usually reserved between a pad and the IGBT cell, to prevent a signal at the pad from affecting the IGBT cell, if the anode pad and the cathode pad are disposed in a middle part of the cell region, a gap needs to be reserved around the anode pad and the cathode pad. Consequently, the area of the IGBT chip is relatively large, and this is not conducive to the miniaturization design of the IGBT chip. However, if the anode pad and the cathode pad are disposed at the edge part of the cell region, a gap needs to be reserved in only three sides of each of the anode pad and the cathode pad, helping reduce the area of the IGBT chip.

DESCRIPTION OF EMBODIMENTS

Figure 1:
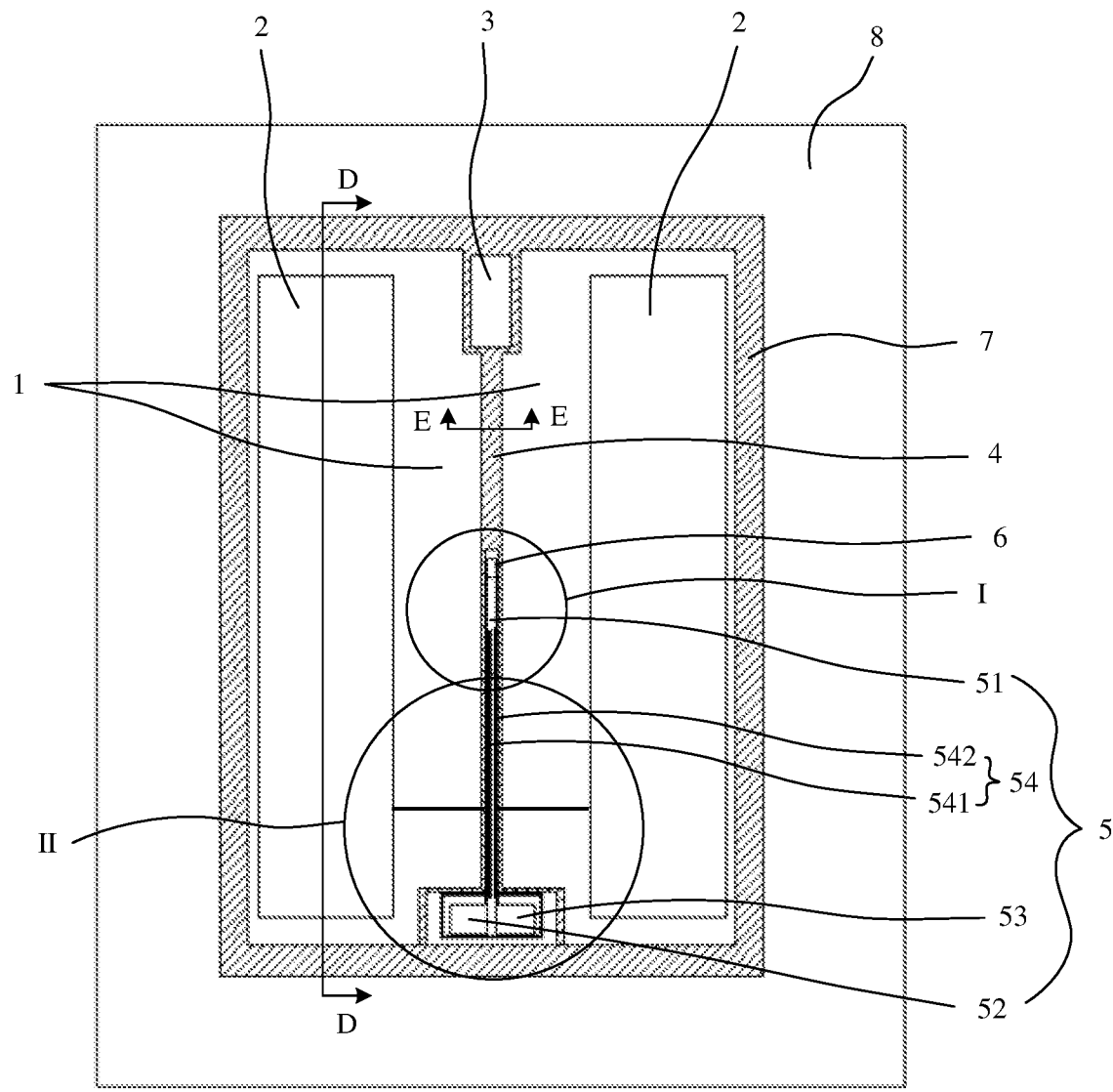
FIG. 1 is an example schematic diagram of a structure of an IGBT chip integrating a temperature sensor according to some embodiments of this disclosure.

In descriptions of this disclosure, terms "first", "second", and "third" are only for a purpose of description, and shall not be understood as indicating or implying relative importance or implying a quantity of indicated technical features. Therefore, a feature restricted by "first", "second", or "third" may explicitly indicate or implicitly include one or more such features.

This disclosure relates to an IGBT chip integrating a temperature sensor. The following briefly describes concepts used in this disclosure.

Cell region: This region is a working region of an IGBT chip, includes a plurality of IGBT cells, and is a main region in which the IGBT chip generates a junction temperature. A temperature sensor is integrated into the cell region.

Terminal region: This region surrounds a periphery of the cell region to ensure pressure resistance of an IGBT chip.

Pad: A window opened on a passivation layer on a surface of an IGBT chip, on which a lead is connected during packaging. The pad is connected to a pin on a package case, to lead out a potential.

Gate bus: To reduce series resistance of polysilicon gates of a plurality of IGBT cells, a potential of a gate pad is usually led to a position farther away from the gate pad by using a polysilicon bus and a metal bus that are parallel to each other, to reduce a difference among gate potentials of all IGBT cells in a cell region, so that a plurality of IGBT cells in the cell region can be fully turned on. The gate bus is usually disposed at an edge of the cell region.

Gate finger structure: To reduce series resistance of polysilicon gates of a plurality of IGBT cells, a potential of a gate pad is usually led to a position farther away from the gate pad by using a polysilicon bus and a metal bus that are parallel to each other, to reduce a difference among gate potentials of all IGBT cells in the cell region, so that a plurality of IGBT cells in the cell region can be fully turned on. The gate finger structure is usually located in the cell region.

The temperature sensor is integrated into the cell region. Specifically, the temperature sensor may be integrated into the gate finger structure in the cell region. In this way, on one hand, because the gate finger structure is located in the cell region, and a temperature inside the cell region is relatively high, the temperature sensor can detect a true temperature of an IGBT chip, thereby improving accuracy of temperature monitoring. On the other hand, because the temperature sensor is integrated into the gate finger structure in the cell region, the temperature sensor does not occupy an effective area of the cell region, helping implement miniaturization design of the IGBT chip. However, when the temperature sensing module is integrated into the gate finger structure, a distance between the gate finger structure and a metal lead of the temperature sensor is quite short. When the IGBT chip is turned on, voltages (VGE) loaded between gates and emitters of a plurality of cells gradually increase, relatively large dV/dt and dI/dt are generated on the gate finger structure, and a coupling effect is further generated with equivalent inductance on the metal lead of the temperature sensor. Consequently, an electromagnetic interference (EMI) effect is introduced into a circuit in which the temperature sensor is located. As a result, crosstalk occurs between a sampling signal of the temperature sensor and current fluctuation and voltage fluctuation caused by the EMI effect, affecting accuracy of sampling and monitoring of the temperature sensor.

To avoid the foregoing problem, this disclosure provides an IGBT chip integrating a temperature sensor, and the IGBT chip is applied to a field of an electric vehicle, an elevator, a variable frequency household appliance, industrial control, a new energy source, a smart grid, and the like.

FIG. 1 is a schematic diagram of a structure of an IGBT chip integrating a temperature sensor according to some embodiments of this disclosure. As shown in FIG. 1, the IGBT chip includes a cell region 1, an emitter pad 2, a gate pad 3, a gate finger structure 4, a temperature sensing module 5, and a conductive shielding structure 6.

Figure 2:
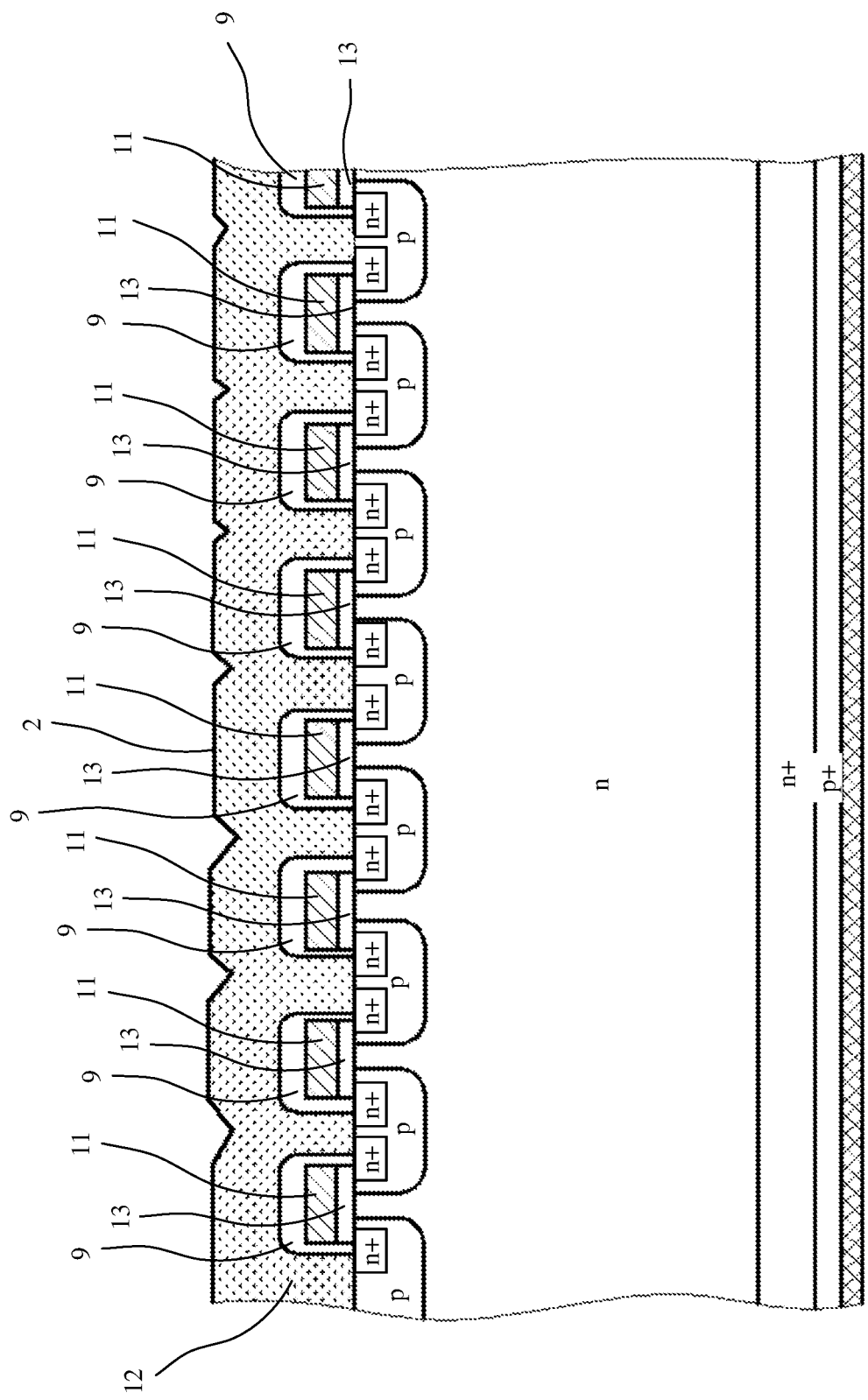
FIG. 2 is an example sectional view of an IGBT chip integrating a temperature sensor shown in FIG. 1 along a cross section D-D.

FIG. 2 is a sectional view of an IGBT chip integrating a temperature sensor shown in FIG. 1 along a cross section D-D. As shown in FIG. 2, the cell region 1 includes a plurality of IGBT cells, and the IGBT cells have a plurality of structures such as a planar gate structure and a trench gate structure. FIG. 2 shows only one of these structures. This is not considered as limiting this disclosure. A gate 11 of the IGBT cell is disposed on an oxide layer 13, a material of the gate 11 of the IGBT cell is polysilicon, a material of an emitter of the IGBT cell is metal, and emitters of a plurality of IGBT cells may be interconnected to form an entire layer of metal 12, and the layer of metal 12 and the gate 11 of the IGBT cell are separated by using a medium layer 9.

The emitter pad 2 is disposed on the cell region 1, and is electrically connected to the emitters of a plurality of IGBT cells of the cell region 1. Optionally, the emitter pad 2 is a window opened on a surface passivation layer of the metal 12.

As shown in FIG. 1, the gate pad 3 and the gate finger structure 4 each are located in the cell region 1. A material of the gate pad 3 is metal. The gate finger structure 4 may extend along a straight line or a curve, and a quantity of gate finger structures 4 may be one or more than two. The gate finger structure 4 may divide the cell region 1 into a plurality of parts, and this is not specifically limited herein. FIG. 1 shows only an example in which a quantity of gate finger structures 4 is one, and the gate finger structure 4 extends along a straight line and divides the cell region 1 into two parts. This is not considered as limiting this disclosure. When the gate finger structure 4 divides the cell region 1 into a plurality of parts, optionally, the cell region 1 of each part is provided with the emitter pad 2.

Figure 3:
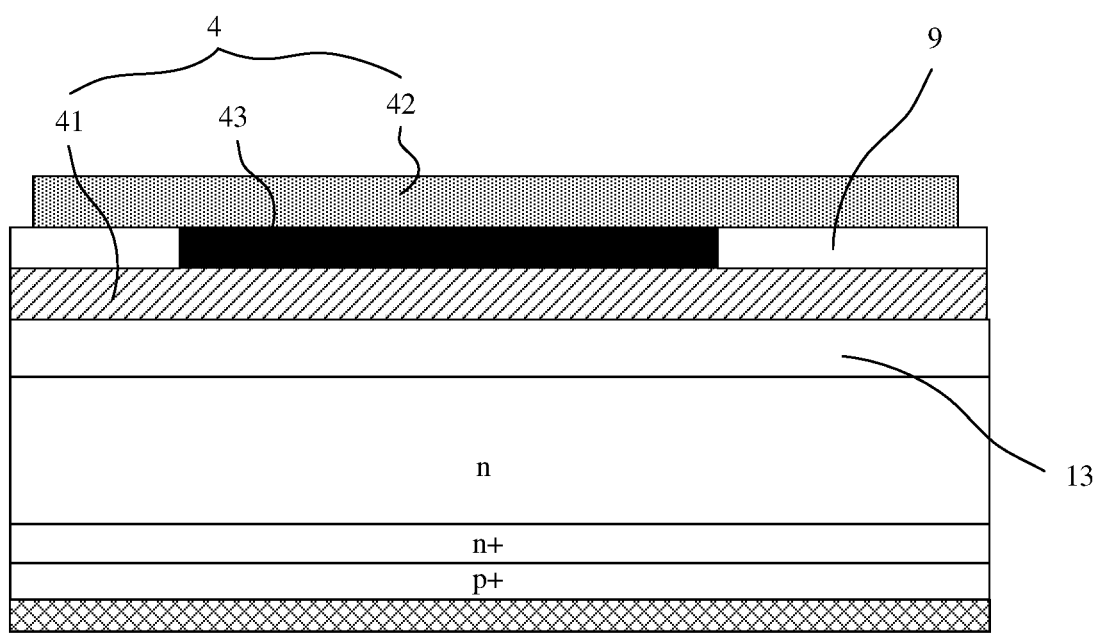
FIG. 3 is an example sectional view of a gate finger structure of an IGBT chip integrating a temperature sensor shown in FIG. 1 along a cross section E-E.

The gate finger structures 4 are connected between the gate pad 3 and the gates 11 of the plurality of IGBT cells. Specifically, a connection relationship among the gate finger structure 4, the gate pad 3, and the gates 11 of the plurality of IGBT cells may be as follows: FIG. 3 is a sectional view of a gate finger structure 4 of an IGBT chip integrating a temperature sensor shown in FIG. 1 along a cross section E-E. As shown in FIG. 3, the gate finger structure 4 includes a first polysilicon bus 41, a first metal bus 42, and a first contact hole 43. The first polysilicon bus 41 is connected to the gate 11 of the IGBT cell in the cell region 1, the first metal bus 42 is electrically connected to the gate pad 3, the first metal bus 42 and the first polysilicon bus 41 are separated by using the medium layer 9, and the first polysilicon bus 41 is electrically connected to the first metal bus 42 through the first contact hole 43. The first contact hole 43 includes a hole body and a conductive material filled in the hole body, and the conductive material includes but is not limited to metals such as aluminum and tungsten. In this way, the gate finger structure 4 leads a potential of the gate pad 3 into each position on the first polysilicon bus 41 through the first metal bus 42, and further leads the potential into the gates 11 of the plurality of IGBT cells through the first polysilicon bus 41, thereby ensuring that potentials loaded onto the gates 11 of the plurality of IGBT cells are approximately equal. In this way, the plurality of IGBT cells in the cell region 1 can be fully turned on.

In the foregoing embodiment, the first polysilicon bus 41 and the gate 11 of the IGBT cell in the cell region 1 each may be disposed on the oxide layer 13. In this way, when the first polysilicon bus 41 and the gate 11 of the IGBT cell are produced, the first polysilicon bus 41 and the gate 11 of the IGBT cell in the cell region 1 can be obtained by etching a same layer of polysilicon, thereby improving production efficiency of the first polysilicon bus 41 and the gate 11 of the IGBT cell in the cell region 1.

Figure 13:
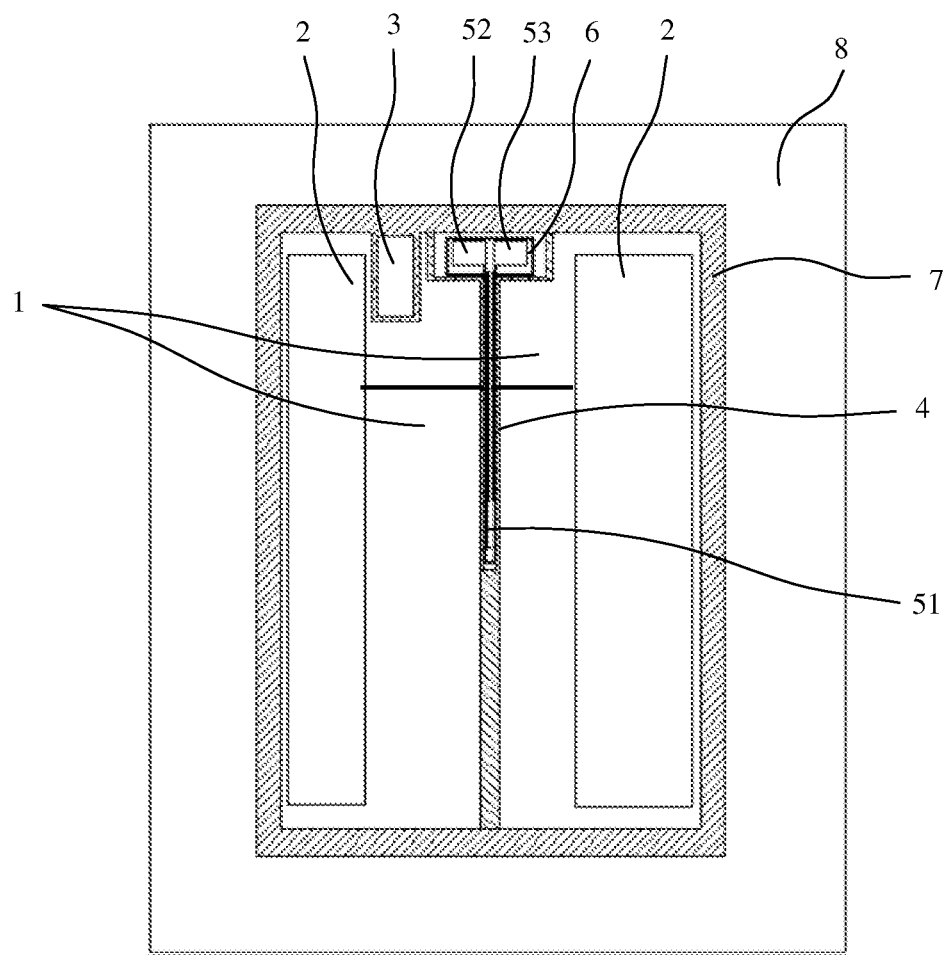
FIG. 13 is an example schematic diagram of a structure of an IGBT chip integrating a temperature sensor according to some other embodiments of this disclosure.

The first metal bus 42 may be directly electrically connected to the gate pad 3, or may be electrically connected to the gate pad 3 through another intermediate structure. This is not specifically limited herein. In some embodiments, as shown in FIG. 1, the first metal bus in the gate finger structure 4 is directly electrically connected to the gate pad 3. In some other embodiments, FIG. 13 is a schematic diagram of a structure of an IGBT chip integrating a temperature sensor according to some other embodiments of this disclosure. As shown in FIG. 13, a first metal bus in a gate finger structure 4 is electrically connected to a gate pad 3 through a metal bus in a gate bus 7.

Figure 4:
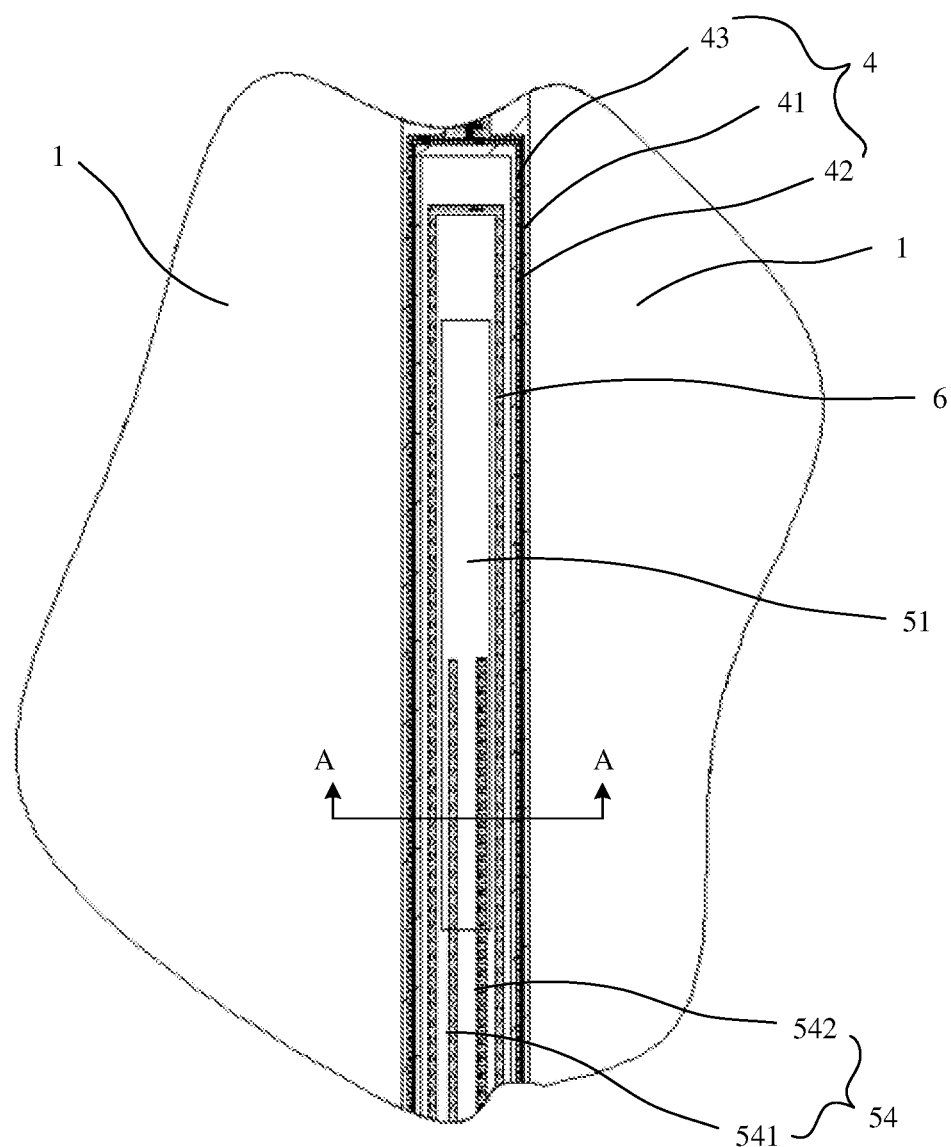
FIG. 4 is an example enlarged view of a region I in an IGBT chip integrating a temperature sensor shown in FIG. 1.
Figure 7:
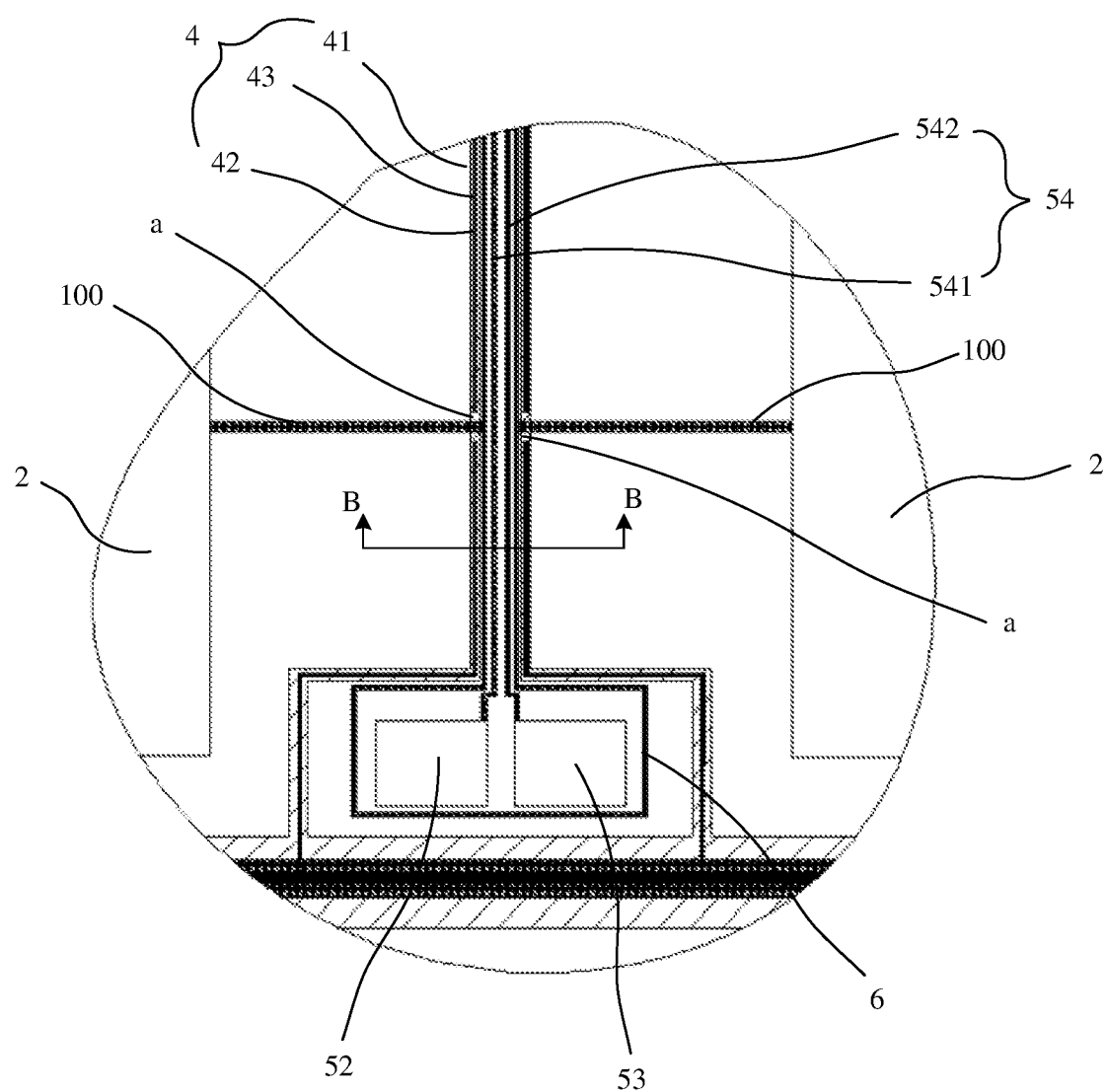
FIG. 7 is an example enlarged view of a region II in an IGBT chip integrating a temperature sensor shown in FIG. 1.

FIG. 4 is an enlarged view of a region I in an IGBT chip integrating a temperature sensor shown in FIG. 1. FIG. 7 is an enlarged view of a region II in an IGBT chip integrating a temperature sensor shown in FIG. 1. As shown in FIG. 4 and FIG. 7, a temperature sensing module 5 includes a temperature sensor 51, an anode pad 52, a cathode pad 53, and a metal lead 54. The metal lead 54 is connected among the temperature sensor 51, the anode pad 52, and the cathode pad 53. The metal lead 54 includes an anode lead 541 and a cathode lead 542, the anode lead 541 is connected between the anode pad 52 and the temperature sensor 51, and the cathode lead 542 is connected between the temperature sensor 51 and the cathode pad 53. The temperature sensor 51 and at least a part of the metal lead 54 are located in the gate finger structure 4, and are insulated from the gate finger structure 4. The conductive shielding structure 6 is at least disposed between the gate finger structure 4 and a part that is of the metal lead 54 and that is located in the gate finger structure 4, and is insulated from the metal lead 54 and the gate finger structure 4. As shown in FIG. 7, the conductive shielding structure 6 is electrically connected to the emitter pad 2.

In the IGBT chip provided in this embodiment of this disclosure, the IGBT chip includes the cell region 1, the emitter pad 2, the gate pad 3, the gate finger structure 4, and the temperature sensing module 5, the gate finger structure 4 passes through the cell region 1, and the temperature sensor 51 and the at least a part of the metal lead 54 that are of the temperature sensing module 5 are located in the gate finger structure 4. Therefore, a true temperature of the IGBT chip can be detected by using the temperature sensor 51, thereby improving accuracy of temperature monitoring. In addition, the IGBT chip further includes a conductive shielding structure 6. The conductive shielding structure 6 is at least disposed between the gate finger structure 4 and the part that is of the metal lead 54 and that is located in the gate finger structure 4, the conductive shielding structure 6 is electrically connected to the emitter pad 2, and the emitter pad 2 is usually grounded. Therefore, the conductive shielding structure 6 may be used to perform shielding between a transmission signal in the metal lead 54 and a transmission signal in the gate finger structure 4, to prevent crosstalk between the transmission signal in the metal lead 54 and the transmission signal in the gate finger structure 4, thereby ensuring accuracy of sampling and monitoring of the temperature sensing module 5.

When a quantity of emitter pads 2 on the IGBT chip is two or more, the conductive shielding structure 6 may be electrically connected to one of the emitter pads 2, or may be electrically connected to each of the two or more emitter pads 2. This is not specifically limited herein. For example, as shown in FIG. 7, the quantity of emitter pads 2 on the IGBT chip is two, and the conductive shielding structure 6 may be electrically connected to one of the emitter pads 2, or may be electrically connected to both of the two emitter pads 2. FIG. 7 shows only an example in which the conductive shielding structure 6 is electrically connected to both of the two emitter pads 2, and does not constitute a limitation on this disclosure.

Figure 10:
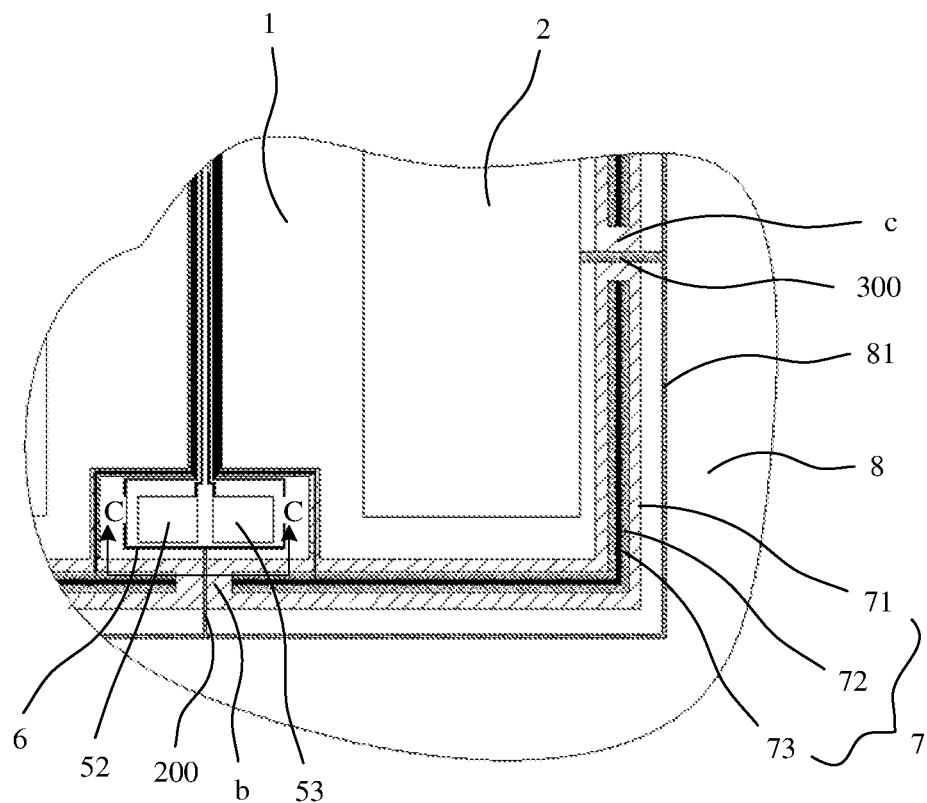
FIG. 10 is an example enlarged view of a region III in an IGBT chip integrating a temperature sensor shown in FIG. 9.
Figure 11:
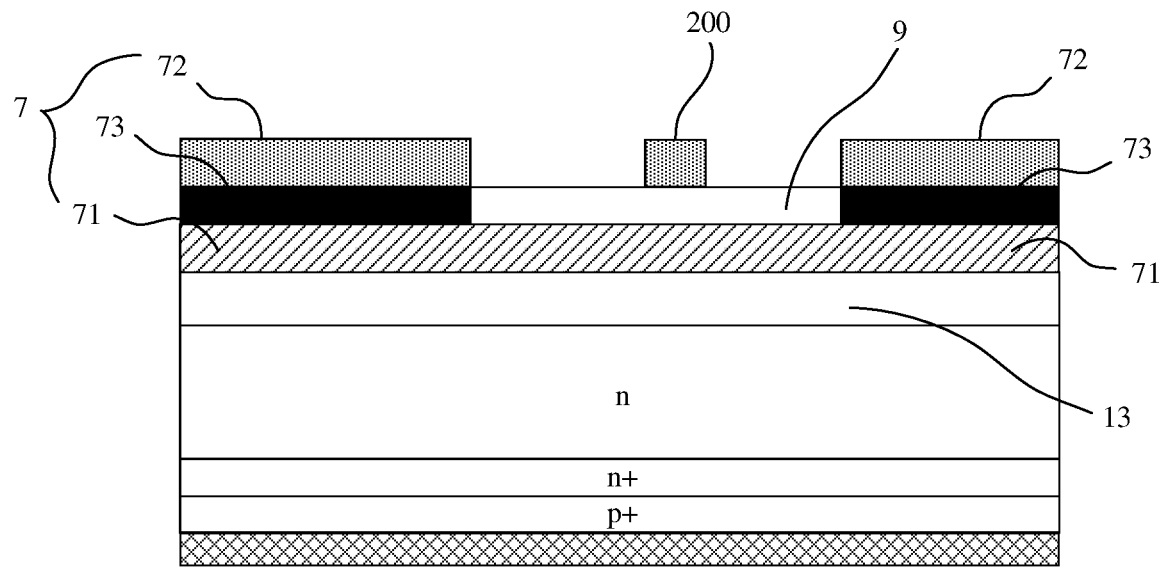
FIG. 11 is an example sectional view of an IGBT chip integrating a temperature sensor shown in FIG. 10 along a cross section C-C.

In some embodiments, as shown in FIG. 1, the IGBT chip further includes a gate bus 7, and the gate bus 7 is disposed at an edge of the cell region 1. Specifically, the gate bus 7 may be disposed at an edge of a side, edges of two opposite sides, edges of three sides, or an edge of a periphery of the cell region 1. This is not specifically limited herein. FIG. 1 shows only an example in which the gate bus 7 is disposed at the edge of the periphery of the cell region 1, and does not constitute a limitation on this disclosure. The gate bus 7 in the IGBT chip integrating the temperature sensor shown in FIG. 1 is the same as a gate bus 7 in an IGBT chip integrating a temperature sensor shown in FIG. 10. FIG. 11 is a sectional view of an IGBT chip integrating a temperature sensor shown in FIG. 10 along a cross section C-C. As shown in FIG. 10 and FIG. 11, the gate bus 7 includes a third polysilicon bus 71, a third metal bus 72, and a third contact hole 73. The third polysilicon bus 71 is connected to the gate 11 of the IGBT cell in the cell region 1, the third metal bus 72 is electrically connected to the gate pad 3, the third metal bus 72 and the third polysilicon bus 71 are separated by using the medium layer 9, and the third polysilicon bus 71 is electrically connected to the third metal bus 72 through the third contact hole 73. The third contact hole 73 includes a hole body and a conductive material filled in the hole body, and the conductive material includes but is not limited to metals such as aluminum and tungsten. In this way, the gate bus 7 leads the potential of the gate pad 3 into each position on the third polysilicon bus 71 through the third metal bus 72, and further leads the potential into the gates of the plurality of IGBT cells through the third polysilicon bus 71, thereby ensuring that potentials loaded onto the gates 11 of the plurality of IGBT cells are approximately equal. In this way, the plurality of IGBT cells in the cell region 1 can be fully turned on.

In the foregoing embodiment, optionally, the third polysilicon bus 71 and the gate 11 of the IGBT cell in the cell region 1 each are disposed on the oxide layer 13. In this way, when the third polysilicon bus 71 and the gate 11 of the IGBT cell are produced, the third polysilicon bus 71 and the gate 11 of the IGBT cell in the cell region 1 can be obtained by etching a same layer of polysilicon, thereby improving production efficiency of the third polysilicon bus 71 and the gate 11 of the IGBT cell.

Figure 5:
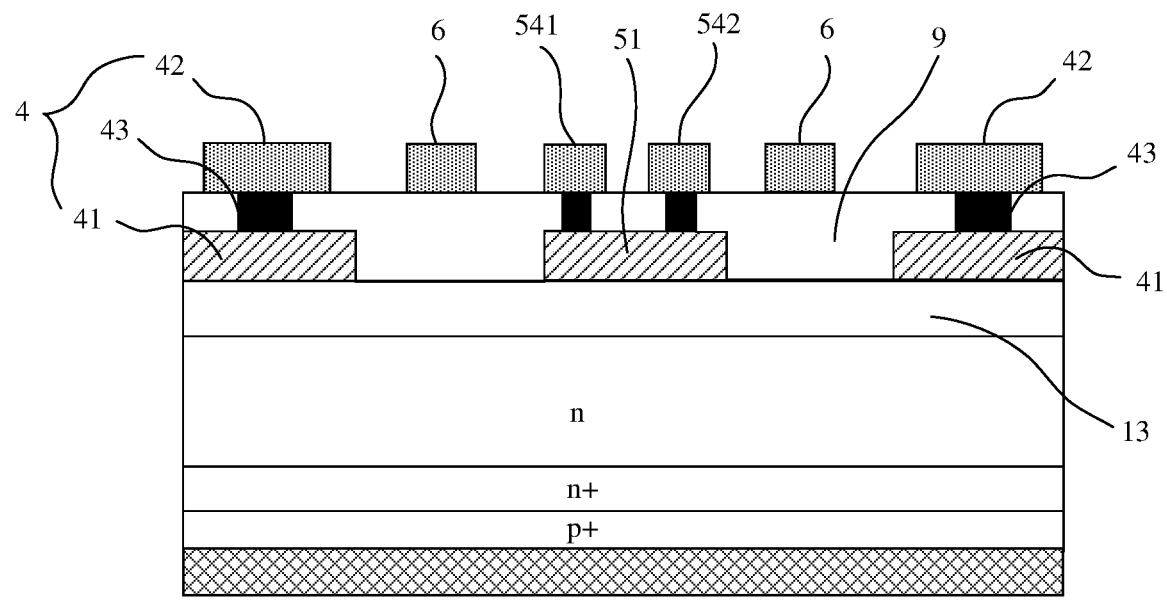
FIG. 5 is an example schematic diagram of a structure of a cross section of a gate finger structure and a temperature sensing module in an IGBT chip integrating a temperature sensor shown in FIG. 4 along A-A.
Figure 8:
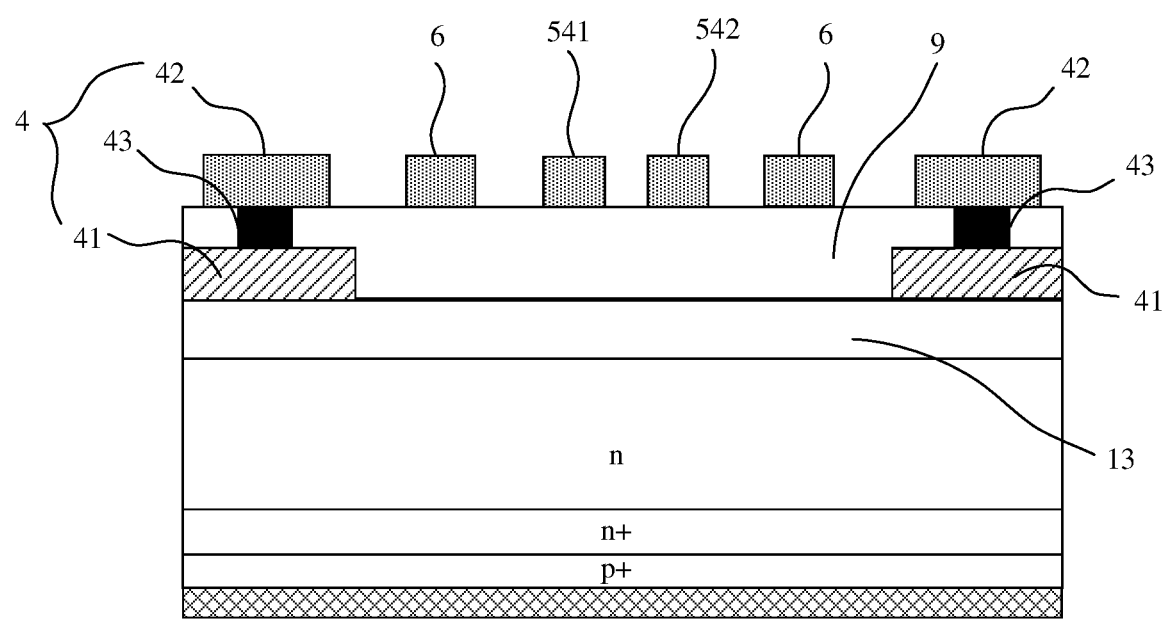
FIG. 8 is an example schematic diagram of a structure of a cross section of a gate finger structure and a temperature sensing module in an IGBT chip integrating a temperature sensor shown in FIG. 7 along B-B.

To shield a signal between the metal lead 54 and the gate finger structure 4, a structure of the conductive shielding structure 6 may have the following two optional implementations:

In a first optional implementation, FIG. 5 is a schematic diagram of a structure of a cross section of a gate finger structure and a temperature sensing module in an IGBT chip integrating a temperature sensor shown in FIG. 4 along A-A, and FIG. 8 is a schematic diagram of a structure of a cross section of a gate finger structure and a temperature sensing module in an IGBT chip integrating a temperature sensor shown in FIG. 7 along B-B. As shown in FIG. 5 and FIG. 8, the conductive shielding structure 6 is a metal wire at least disposed between the first metal bus 42 and the part that is of the metal lead (including an anode lead 541 and a cathode lead 542) and that is located in the gate finger structure 4. This structure is simple, and has low costs.

Optionally, as shown in FIG. 5 and FIG. 8, the first metal bus 42, the metal lead (including the anode lead 541 and the cathode lead 542), and the conductive shielding structure 6 each are disposed on the medium layer 9. In this way, when the first metal bus 42, the metal lead, and the conductive shielding structure 6 are produced, the first metal bus 42, the metal lead, and the conductive shielding structure 6 can be obtained by etching a same layer of metal, thereby improving production efficiency of the first metal bus 42, the metal lead, and the conductive shielding structure 6.

Figure 6:
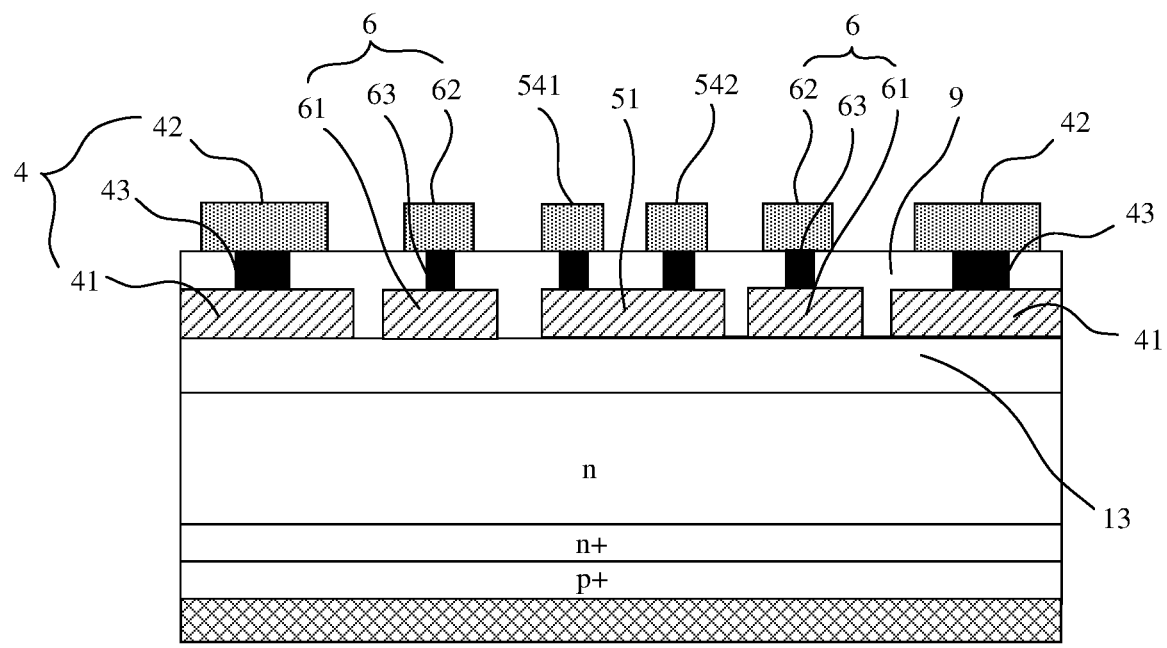
FIG. 6 is an example schematic diagram of a structure of another cross section of a gate finger structure and a temperature sensing module in an IGBT chip integrating a temperature sensor shown in FIG. 4 along A-A.

In a second optional implementation, FIG. 6 is a schematic diagram of a structure of another cross section of a gate finger structure and a temperature sensing module in an IGBT chip integrating a temperature sensor shown in FIG. 4 along A-A. As shown in FIG. 6, the conductive shielding structure 6 includes a second polysilicon bus 61, a second metal bus 62, and a second contact hole 63. The second polysilicon bus 61 and the second metal bus 62 are separated by using the medium layer 9, and the second polysilicon bus 61 is electrically connected to the second metal bus 62 through the second contact hole 63. The second contact hole 63 includes a hole body and a conductive material filled in the hole body, and the conductive material includes but is not limited to metals such as aluminum and tungsten. The second polysilicon bus 61 is at least located between the first polysilicon bus 41 and the part that is of the metal lead (including an anode lead 541 and a cathode lead 542) and that is located in the gate finger structure 4, the second metal bus 62 is at least located between the first metal bus 42 and the part that is of the metal lead and that is located in the gate finger structure 4, and the conductive shielding structure 6 is electrically connected to the emitter pad 2 through the second metal bus 62. In this structure, a shielding channel including the conductive shielding structure 6 is relatively great in height, to effectively prevent the crosstalk between the transmission signal in the metal lead and the transmission signal in the gate finger structure 4, thereby ensuring the accuracy of sampling and monitoring of the temperature sensing module 5.

Optionally, the second polysilicon bus 61 and the first polysilicon bus 41 each may be disposed on the oxide layer 13. In this way, when the second polysilicon bus 61 and the first polysilicon bus 41 are produced, the second polysilicon bus 61 and the first polysilicon bus 41 can be obtained by etching a same layer of polysilicon, thereby improving production efficiency of the second polysilicon bus 61 and the first polysilicon bus 41.

Because the conductive shielding structure 6 and the metal lead 54 each are located in the gate finger structure 4, and the emitter pad 2 is located outside the gate finger structure 4, to implement electrical connection between the conductive shielding structure 6 and the emitter pad 2, an electrical connection line 100 between the conductive shielding structure 6 and the emitter pad 2 needs to pass through the gate finger structure 4 or the gate bus 7, and needs to be insulated from the gate finger structure 4 and the gate bus 7. Specifically, the electrical connection between the conductive shielding structure 6 and the emitter pad 2 may be implemented by using the following two embodiments.

In a first embodiment, as shown in FIG. 7, a first breakpoint a is provided on a part that is of the gate finger structure 4 and that is located between the conductive shielding structure 6 and the emitter pad 2, and the electrical connection line 100 between the conductive shielding structure 6 and the emitter pad 2 passes through the first breakpoint a. This structure is simple and easy to implement, and can implement insulation between the electrical connection line 100 and the gate finger structure 4.

In the foregoing embodiment, the first breakpoint may penetrate through, along a thickness direction of an IGBT, the first polysilicon bus 41, the first metal bus 42, and the first contact hole 43 that are of the gate finger structure 4, and the electrical connection line 100 and the oxide layer 13 are separated by using the medium layer 9, or may penetrate through, along the thickness direction of the IGBT, only the first metal bus 42 and the first contact hole 43, and the electrical connection line 100 and the first polysilicon bus 41 are separated by using the medium layer 9. This is not specifically limited herein.

In some embodiments, the electrical connection line 100, a metal part of the conductive shielding structure 6, the emitter pad 2, and the first metal bus 42 of the gate finger structure 4 are obtained by etching a same layer of metal. In this way, the electrical connection line 100, the metal part of the conductive shielding structure 6, the emitter pad 2, and the first metal bus 42 of the gate finger structure 4 have relatively high production efficiency.

Figure 9:
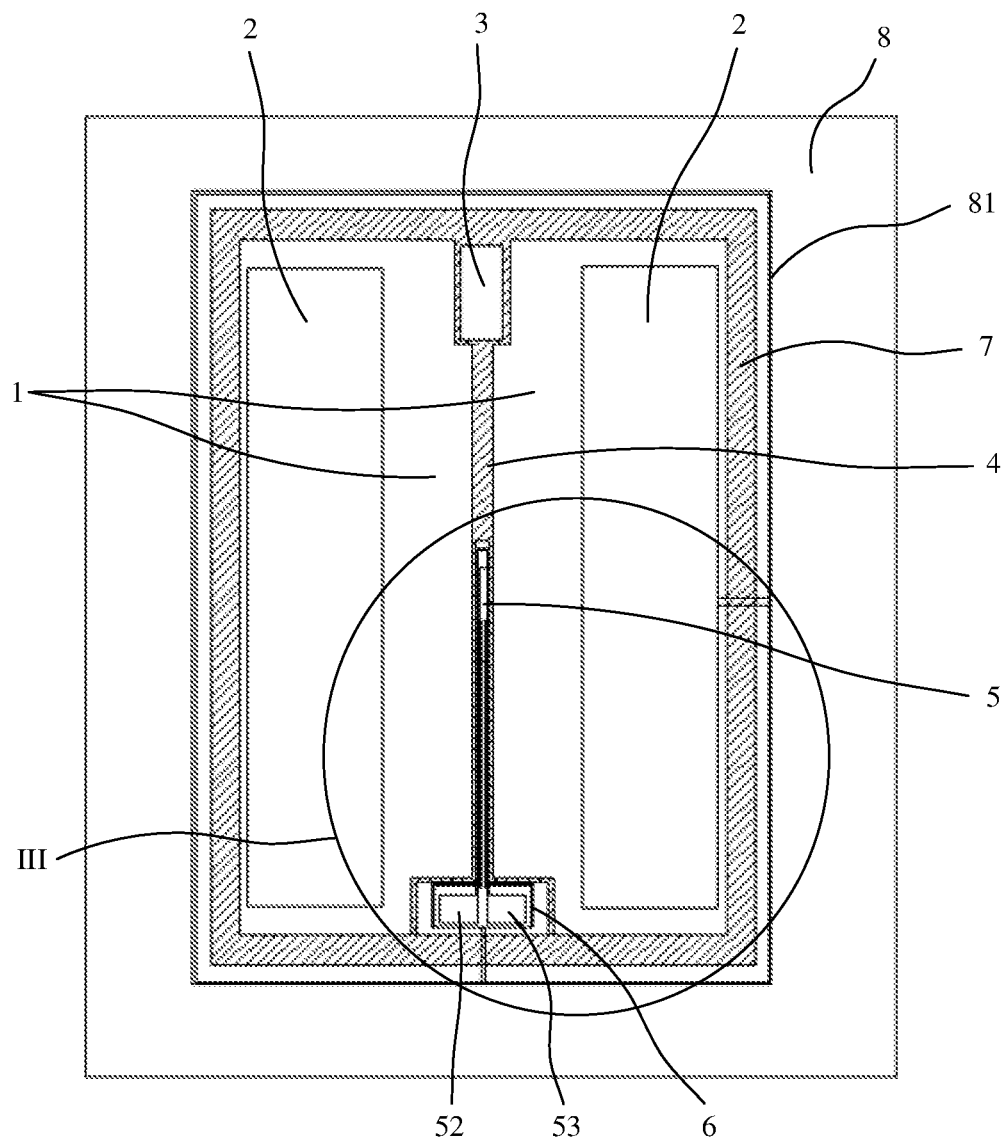
FIG. 9 is an example schematic diagram of a structure of an IGBT chip integrating a temperature sensor according to some other embodiments of this disclosure.

In a second embodiment, FIG. 9 is a schematic diagram of a structure of an IGBT chip integrating a temperature sensor according to some other embodiments of this disclosure. A difference between the IGBT chip shown in FIG. 9 and the IGBT chip shown in FIG. 1 lies in that an electrical connection path between the conductive shielding structure 6 and the emitter pad 2 varies, and others are all the same, such as a structure and disposed position of the cell region 1, a size and disposed position of the emitter pad 2, a size and disposed position of the gate pad 3, a structure and disposed position of the gate finger structure 4, the temperature sensing module 5, the gate bus 7, and a terminal region 8. As shown in FIG. 9, the IGBT chip further includes the terminal region 8, and the terminal region 8 is disposed at the periphery of the cell region 1. A metal loop line 81 is provided in the terminal region 8, the metal loop line 81 is disposed around the periphery of the cell region 1, and the metal loop line 81 is electrically connected to the emitter pad 2. FIG. 10 is an enlarged view of a region III in an IGBT chip integrating a temperature sensor shown in FIG. 9. As shown in FIG. 10, a second breakpoint b is provided on a part that is of the gate bus 7 and that is located between the conductive shielding structure 6 and the metal loop line 81, the conductive shielding structure 6 is electrically connected to the metal loop line 81, and an electrical connection line 200 between the conductive shielding structure 6 and the metal loop line 81 passes through the second breakpoint b. In this way, the conductive shielding structure 6 is electrically connected to the emitter pad 2 by using the metal loop line 81 of the terminal region 8. This structure is simple and easy to implement, and can implement insulation between the electrical connection line 200 and the gate bus 7.

In the foregoing embodiment, the second breakpoint b may penetrate through, along a thickness direction of an IGBT, the third polysilicon bus 71, the third metal bus 72, and the third contact hole 73 that are of the gate bus 7, and the electrical connection line 200 and the oxide layer 13 are separated by using the medium layer 9, or may penetrate through, along the thickness direction of the IGBT, only the third metal bus 72 and the third contact hole 73, and the electrical connection line 200 and the third polysilicon bus 71 are separated by using the medium layer 9. This is not specifically limited herein.

In some embodiments, the electrical connection line 200, a metal part of the conductive shielding structure 6, the metal loop line 81, and the third metal bus 72 of the gate bus 7 are obtained by etching the same layer of metal. In this way, the electrical connection line 200, the metal part of the conductive shielding structure 6, the metal loop line 81, and the third metal bus 72 of the gate bus 7 have relatively high production efficiency.

To implement electrical connection between the metal loop line 81 and the emitter pad 2, optionally, a third breakpoint c is provided on a part that is of the gate bus 7 and that is located between the metal loop line 81 and the emitter pad 2, and an electrical connection line 300 between the metal loop line 81 and the emitter pad 2 passes through the third breakpoint c. The third breakpoint c may penetrate through, along a thickness direction of an IGBT, the third polysilicon bus 71, the third metal bus 72, and the third contact hole 73 that are of the gate bus 7, and the electrical connection line 300 and the oxide layer 13 (refer to FIG. 11) are separated by using the medium layer 9, or may penetrate through, along the thickness direction of the IGBT, only the third metal bus 72 and the third contact hole 73, and the electrical connection line 300 and the third polysilicon bus 71 are separated by using the medium layer 9. This is not specifically limited herein.

The temperature sensor 51 may include a thermistor, and the temperature sensor 51 monitors a temperature by using the thermistor, or the temperature sensor 51 may include a polysilicon diode, and the temperature sensor 51 monitors a temperature by using the polysilicon diode. This is not specifically limited herein.

Figure 14:
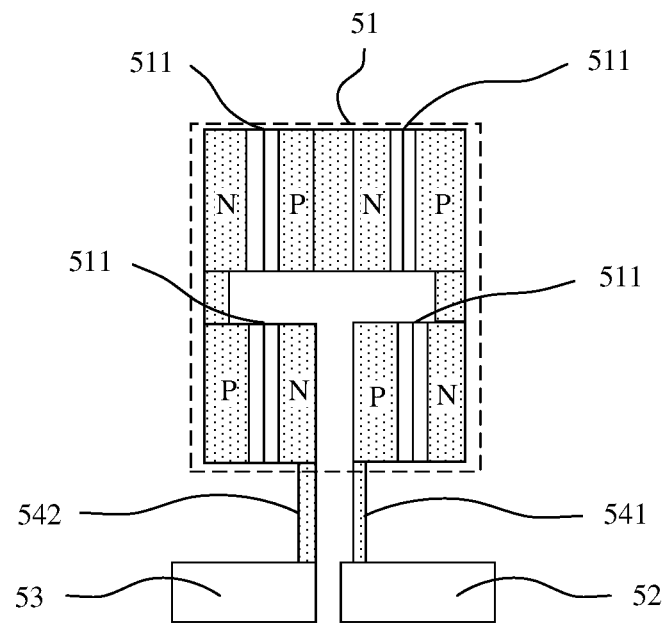
FIG. 14 is an example schematic diagram of a structure of a temperature sensing module in an IGBT chip integrating a temperature sensor according to some embodiments of this disclosure.

FIG. 14 is a schematic diagram of a structure of a temperature sensing module in an IGBT chip integrating a temperature sensor according to some embodiments of this disclosure. As shown in FIG. 14, the temperature sensor 51 includes at least one first polysilicon diode 511, the at least one first polysilicon diode 511 is disposed in series, a P-type region constituting one end of a series structure of the at least one first polysilicon diode 511 is electrically connected to an anode pad 52 through an anode lead 541, and an N-type region constituting the other end of the series structure of the at least one first polysilicon diode 511 is electrically connected to a cathode pad 53 through the cathode lead 542. In this way, the temperature sensor 51 can monitor a temperature by using the at least one first polysilicon diode 511. A polysilicon diode has a small volume, and can be easily integrated into a small-size IGBT chip.

In some embodiments, when the temperature sensor 51 includes the polysilicon diode and monitors a temperature by using the polysilicon diode, as shown in FIG. 5, the temperature sensor 51 and a first polysilicon bus 41 each may be disposed on an oxide layer 13, the temperature sensor 51 and a metal lead (including the anode lead 541 and the cathode lead 542) may be separated by using a medium layer 9, and the temperature sensor 51 may be electrically connected to each of the anode lead 541 and the cathode lead 542 through a contact hole.

A quantity of first polysilicon diodes 511 included in the temperature sensor 51 may be 1, 2, 3, or the like. This is not specifically limited herein. In some embodiments, the quantity of first polysilicon diodes 511 included in the temperature sensor 51 ranges from 2 to 6. For example, as shown in FIG. 14, the quantity of first polysilicon diodes 511 included in the temperature sensor 51 is 4.

Figure 15:
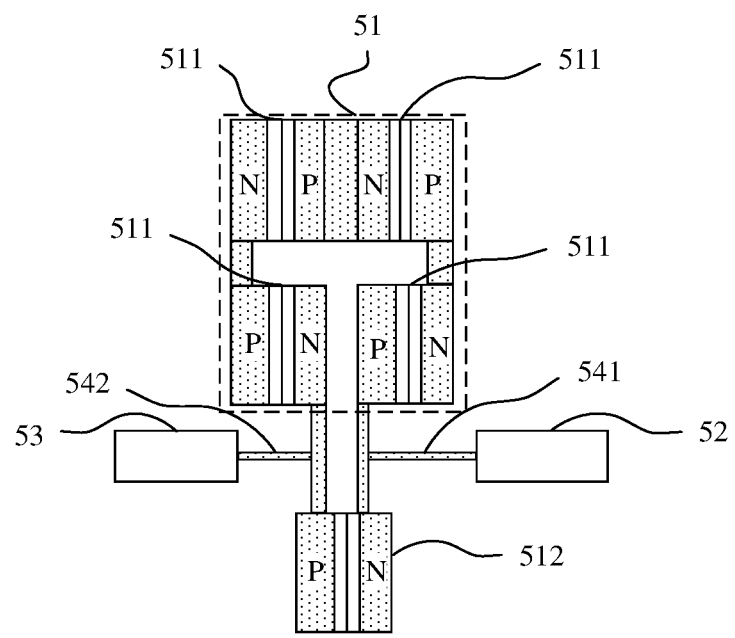
FIG. 15 is an example schematic diagram of another structure of a temperature sensing module in an IGBT chip integrating a temperature sensor according to some embodiments of this disclosure.

FIG. 15 is a schematic diagram of another structure of a temperature sensing module in an IGBT chip integrating a temperature sensor according to some embodiments of this disclosure. As shown in FIG. 15, the temperature sensor 51 includes not only at least one first polysilicon diode 511, but also at least one second polysilicon diode 512. The at least one second polysilicon diode 512 is disposed in series, an N-type region constituting one end of a series structure of the at least one second polysilicon diode 512 is electrically connected to an anode pad 52 through an anode lead 541, and a P-type region constituting the other end of the series structure of the at least one second polysilicon diode 512 is electrically connected to a cathode pad 53 through the cathode lead 542. In this way, the at least one second polysilicon diode 512 and the at least one first polysilicon diode 511 are connected in anti-parallel, so that the temperature sensor 51 can be prevented from being broken down when a reverse voltage is applied.

In the foregoing embodiment, a quantity of second polysilicon diodes 512 included in the temperature sensor 51 may be 1, 2, 3, or the like. This is not specifically limited herein.

The anode pad 52 and the cathode pad 53 may be disposed in a middle part of the cell region 1, or may be disposed at an edge part of the cell region 1. This is not specifically limited herein. In some embodiments, as shown in FIG. 1, the anode pad 52 and the cathode pad 53 are disposed at the edge part of the cell region 1. Because a specific gap is usually reserved between a pad and the IGBT cell, to prevent a signal at the pad from affecting the IGBT cell, if the anode pad 52 and the cathode pad 53 are disposed in the middle part of the cell region 1, a gap needs to be reserved around the anode pad 52 and the cathode pad 53. Consequently, an area of the IGBT chip is relatively large, and this is not conducive to the miniaturization design of the IGBT chip. However, if the anode pad 52 and the cathode pad 53 are disposed at the edge part of the cell region 1, a gap needs to be reserved in only three sides of each of the anode pad 52 and the cathode pad 53, helping reduce the area of the IGBT chip.

Similarly, a gate pad 3 may be disposed in the middle part of the cell region 1, or may be disposed at the edge part of the cell region 1. This is not specifically limited herein. In some embodiments, as shown in FIG. 1, the gate pad 3 is disposed at the edge part of the cell region 1. In this way, a gap needs to be reserved in only three sides of the gate pad 3, helping reduce the area of the IGBT chip.

Figure 12:
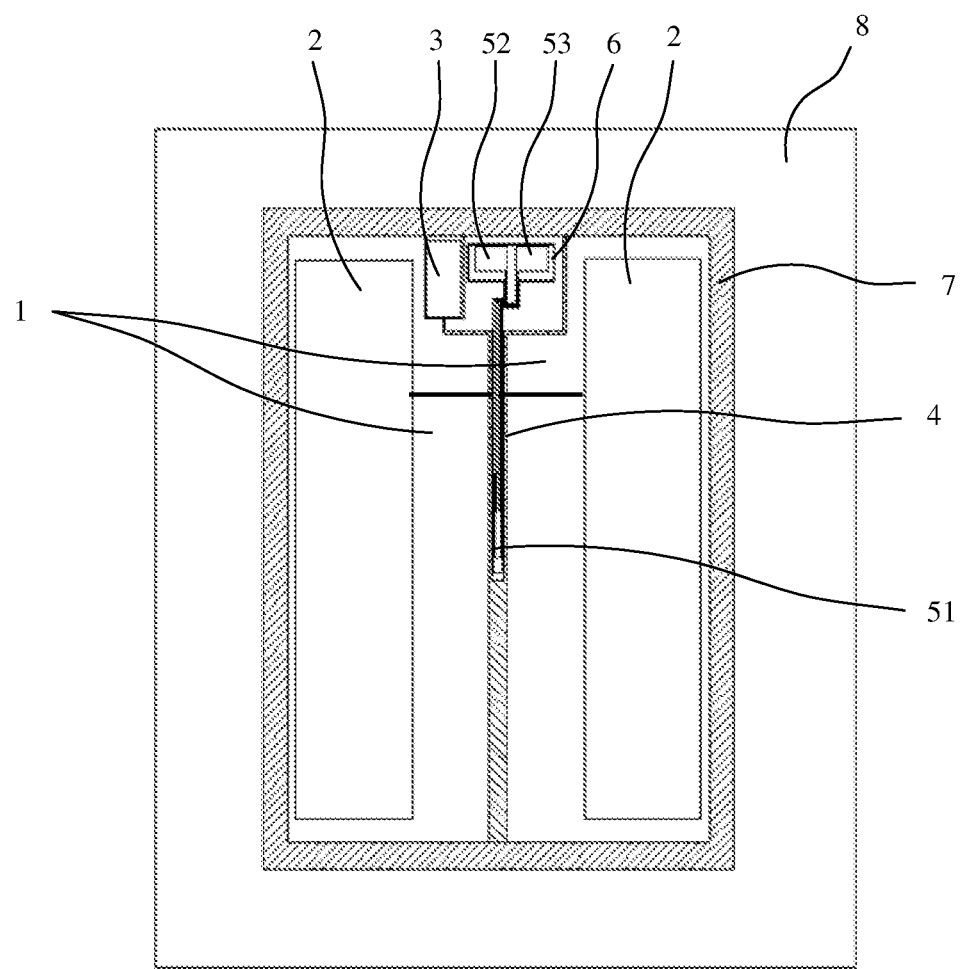
FIG. 12 is an example schematic diagram of a structure of an IGBT chip integrating a temperature sensor according to some other embodiments of this disclosure.

When the anode pad 52, the cathode pad 53, and the gate pad 3 each are located at the edge part of the cell region 1, the anode pad 52, the cathode pad 53, and the gate pad 3 may be located at a same edge part of the cell region 1, or may be located at two opposite edge parts of the cell region 1. This is not specifically limited herein. In some embodiments, as shown in FIG. 12 or FIG. 13, the anode pad 52, the cathode pad 53, and the gate pad 3 are located at a same edge part of the cell region 1. In some other embodiments, as shown in FIG. 1, the anode pad 52 and the cathode pad 53 are located at one edge part of the cell region 1, and the gate pad 3 is located at the other edge part that is of the cell region 1 and that is opposite to the edge part.

A metal lead 54 may extend along a length direction of a gate finger structure 4, and may be entirely disposed in the gate finger structure 4. Alternatively, one part of the metal lead 54 may be located in the gate finger structure 4, and the other part of the metal lead 54 may extend out of a side of the gate finger structure 4 in a direction that intersects with or is perpendicular to the length direction of the gate finger structure 4. This is not specifically limited herein.

In some embodiments, as shown in FIG. 1, the metal lead 54 extends along the length direction of the gate finger structure 4, and is entirely disposed in the gate finger structure 4. In this way, the metal lead 54 does not interfere with emitter metal of the IGBT cell in the cell region, and therefore, the metal lead 54 does not occupy an effective area of the cell region 1. In this way, the area of the IGBT chip can be made relatively small without changing a quantity of IGBT cells in the cell region, thereby meeting a requirement for miniaturization design of the IGBT chip.

In some embodiments, as shown in FIG. 1, the gate finger structure 4 passes through a center of the cell region 1, and the temperature sensor 51 is disposed in a part that is of the gate finger structure 4 and that is located at the center. In this way, the temperature sensor 51 is located at the center of the cell region 1, and a temperature at the center of the cell region 1 is the highest. Therefore, a highest temperature of the cell region 1 can be detected by using the temperature sensor 51, thereby improving accuracy of temperature monitoring.

A conductive shielding structure 6 may be linear or annular. This is not specifically limited herein. In some embodiments, as shown in FIG. 1, FIG. 4, and FIG. 7, the conductive shielding structure 6 is annular, and the conductive shielding structure 6 is disposed around a periphery of the metal lead 54. In this way, the conductive shielding structure 6 can prevent, in a peripheral direction of the metal lead 54, an external signal of the conductive shielding structure 6 from interfering with a transmission signal in the metal lead 54, thereby ensuring accuracy of sampling and monitoring of a temperature sensing module 5.

In the descriptions of this specification, the described specific features, structures, materials, or characteristics may be combined in a proper manner in any one or more of embodiments or examples.

Finally, it should be noted that the foregoing embodiments are merely intended for describing the technical solutions of this disclosure, but not for limiting this disclosure. Although this disclosure is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of embodiments of this disclosure.

What is claimed is:

1. An insulated gate bipolar transistor (IGBT) chip integrating a temperature sensor, comprising:
   a cell region having a plurality of IGBT cells;
   an emitter pad, disposed on the cell region, and electrically connected to emitters of the plurality of IGBT cells;
   a gate pad and a gate finger structure, wherein
      the gate pad and the gate finger structure are located in the cell region, and
      the gate finger structure is connected between the gate pad and gates of the plurality of IGBT cells;
   a temperature sensing module having:
      the temperature sensor,
      an anode pad,
      a cathode pad, and
      a metal lead connected between the temperature sensor, the anode pad, and the cathode pad, wherein
         the temperature sensor and at least a part of the metal lead are located in the gate finger structure and are insulated from the gate finger structure; and
   a conductive shielding structure disposed, at least, between the gate finger structure and a part of the metal lead located in the gate finger structure, wherein
   the conductive shielding structure is insulated from the metal lead and the gate finger structure, and
   the conductive shielding structure is electrically connected to the emitter pad.

2. The IGBT chip integrating the temperature sensor according to claim 1, wherein
   the gate finger structure comprises:
      a first polysilicon bus,
      a first metal bus, and
      a first contact hole, wherein
         the first polysilicon bus and the first metal bus are separated using a medium layer,
         the first polysilicon bus is electrically connected to the first metal bus through the first contact hole; and
   the conductive shielding structure is a metal wire disposed, at least, between the first metal bus and the part of the metal lead located in the gate finger structure.

3. The IGBT chip integrating the temperature sensor according to claim 1, wherein
   the gate finger structure comprises:
      a first polysilicon bus,
      a first metal bus, and
      a first contact hole, wherein
   the first polysilicon bus and the first metal bus are separated using a medium layer, and
   the first polysilicon bus is electrically connected to the first metal bus through the first contact hole; and
   the conductive shielding structure comprises:
      a second polysilicon bus,
      a second metal bus, and
      a second contact hole, wherein
   the second polysilicon bus and the second metal bus are separated using the medium layer,
   the second polysilicon bus is electrically connected to the second metal bus through the second contact hole, the second polysilicon bus is located, at least, between the first polysilicon bus and the part of the metal lead located in the gate finger structure, the second metal bus is located, at least, between the first metal bus and the part of the metal lead located in the gate finger structure, and the conductive shielding structure is electrically connected to the emitter pad through the second metal bus.

4. The IGBT chip integrating the temperature sensor according to claim 1, wherein a first breakpoint is provided on a part of the gate finger structure located between the conductive shielding structure and the emitter pad, and an electrical connection line between the conductive shielding structure and the emitter pad passes through the first breakpoint.

5. The IGBT chip integrating the temperature sensor according to claim 1, further comprising:
a gate bus; and
a terminal region, wherein
the gate bus is disposed at an edge of the cell region, and the terminal region is disposed at a periphery of the cell region;
a metal loop line is provided in the terminal region, the metal loop line is disposed around the periphery of the cell region, and the metal loop line is electrically connected to the emitter pad, and
a second breakpoint is provided on a part the gate bus located between the conductive shielding structure and the metal loop line, the conductive shielding structure is electrically connected to the metal loop line, and an electrical connection line between the conductive shielding structure and the metal loop line passes through the second breakpoint.

6. The IGBT chip integrating the temperature sensor according to claim 1, wherein
the temperature sensor comprises at least one first polysilicon diode,
the at least one first polysilicon diode is disposed in series,
the metal lead comprises an anode lead and a cathode lead,
a P-type region constituting a first end of a series structure of the at least one first polysilicon diode is electrically connected to the anode pad through the anode lead, and
an N-type region constituting a second end of the series structure of the at least one first polysilicon diode is electrically connected to the cathode pad through the cathode lead.

7. The IGBT chip integrating the temperature sensor according to claim 6, wherein the temperature sensor further comprises at least one second polysilicon diode,
the at least one second polysilicon diode is disposed in series,
an N-type region constituting a first end of a series structure of the at least one second polysilicon diode is electrically connected to the anode pad through the anode lead, and
a P-type region constituting a second end of the series structure of the at least one second polysilicon diode is electrically connected to the cathode pad through the cathode lead.

8. The IGBT chip integrating the temperature sensor according to claim 1, wherein the gate finger structure passes through a center of the cell region, and the temperature sensor is disposed in a part of the gate finger structure located at the center of the cell region.

9. The IGBT chip integrating the temperature sensor according to claim 1, wherein the metal lead extends along a length direction of the gate finger structure, and the metal lead is entirely located in the gate finger structure.

10. The IGBT chip integrating the temperature sensor according to claim 1, wherein the conductive shielding structure is annular, and the conductive shielding structure is disposed around a periphery of the metal lead.

11. The IGBT chip integrating the temperature sensor according to claim 1, wherein the anode pad and the cathode pad are disposed at an edge part of the cell region.

12. An insulated gate bipolar transistor (IGBT) chip, comprising:
a cell region having a plurality of IGBT cells;
an emitter pad, disposed on the cell region, and electrically connected to emitters of the plurality of IGBT cells;
a gate pad and a gate finger structure, wherein the gate finger structure is connected between the gate pad and gates of the plurality of IGBT cells;
a temperature sensing module having:
a temperature sensor,
an anode pad,
a cathode pad, and
a metal lead connected between the temperature sensor, the anode pad, and the cathode pad, wherein the temperature sensor and at least a part of the metal lead are located in the gate finger structure and are insulated from the gate finger structure; and
a conductive shielding structure, wherein the conductive shielding structure is insulated from the metal lead and the gate finger structure.

* * * * *